United States Patent [19]
Li et al.

[11] Patent Number: 5,619,516
[45] Date of Patent: Apr. 8, 1997

[54] EFFICIENT CRC REMAINDER COEFFICIENT GENERATION AND CHECKING DEVICE AND METHOD

[75] Inventors: Shiping Li, Canton; James A. Pasco-Anderson, Needham, both of Mass.

[73] Assignee: Motorola, Inc., Schaumburg, Ill.

[21] Appl. No.: 541,168

[22] Filed: Oct. 11, 1995

Related U.S. Application Data

[63] Continuation of Ser. No. 998,193, Dec. 29, 1992, abandoned.

[51] Int. Cl.$^6$ ................................................. H03M 13/00
[52] U.S. Cl. ................................................. 371/53; 371/37.6
[58] Field of Search .......................... 371/37.1, 53, 37.6

[56] References Cited

U.S. PATENT DOCUMENTS

| | | | |
|---|---|---|---|
| 4,473,902 | 9/1984 | Chen | 371/37.8 |
| 5,325,372 | 6/1994 | Ish-Shalom | 371/37.6 |

OTHER PUBLICATIONS

Weissberger, A., "Control Chip Handles Error Checking and Character–Based Protocols Easily", *Electronics*, Mar. 27, 1980, pp. 151–155.

Tong–Bi Pei and Charles Zukowski, "High–Speed Parallel CRC Circuits in VLSI," IEEE Transactions on Communications, vol. 40, No. 4, Apr. 1992.

Dilip V. Sarwate, "Computation of Cyclic Redundancy Checks Via Table Look–Up," Communications of the ACM, vol. 31, No. 8, Aug. 1988.

Georgia Griffiths and G. Carlyle Stones, "The Tea–Leaf Reader Algorithm: An Efficient Implementation of CRC–16 and CRC–32," Communications of the ACM, vol. 30, No. 7, Jul. 1987.

Yoseph Linde, "A Fast Algorithm for Calculating Cyclic Redundancy Checks," Correlations, Fall 1979.

Guido Albertengo and Riccardo Sisto, "Parallel CRC Generation," IEEE Micro, Oct. 1990.

D. Bertsekas and R. Gallager, Data Link Control and Communication Channels p. 548.

Karl M. Helness, "Implementation of a Parallel Cyclic Redundancy Check Generator," Computer Design, Mar. 1974.

Aram Perez, "Byte–wise CRC Calculations," IEEE Micro, Jun. 1983.

Tenkasi V. Ramabadran and Sunil S. Gaitonde, "A Tutorial on CRC Computations," IEEE Micro, Aug. 1988.

*Primary Examiner*—Stephen M. Baker
*Attorney, Agent, or Firm*—Darleen J. Stockley

[57] ABSTRACT

A parallel CRC remainder coefficient generator (100) and method (1100) are described for providing efficient error detection in a digital data communication system. This method calculates a K-bit CRC remainder m data bits at a time, where m can be less than, equal to, or greater than K, and where the processing of each of the m bits requires a total of j, K-bit table look-ups into a total of j tables of $2^b$ entries each, where m=jb. It also requires one m-bit exclusive-or operation, a total of (j−1) K-bit exclusive-or operations, and one (K−m)-bit exclusive-or operation if m<K. An implementation of a 16-bit CRC using the new method (700) in a 16-bit DSP processor with m=16, j=2 and b=8 reduces processor loading by 43% relative to the fastest prior art method which uses m=8, j=1, and b=8. An implementation of a 32-bit CRC using the novel method (600) in a 16-bit DSP processor with m=6, j=2, and b=8 reduces the processor loading by 41% relative to the fastest prior art method which uses m=8, j=1, and b=8. Hardware implementation of the new method provides similar benefits with respect to throughput and area.

16 Claims, 8 Drawing Sheets

1102
IN A CRC CIRCUIT COMBINING UNIT, PERFORMING BITWISE MODULO-TWO ADDITION ON:
   A PLURALITY OF m COEFFICIENTS REPRESENTING m BITS OF AN n+m BIT FRAME (n,m POSITIVE INTEGERS; m > 1; K IS A DEGREE OF A CRC GENERATING POLYNOMIAL (1st ELECTRICAL INPUT DATA) AND
   A PLURALITY OF PREVIOUSLY CALCULATED CRC REMAINDER COEFFICIENTS OF A FIRST n BITS OF THE FRAME, TO PROVIDE A PLURALITY OF ADJUSTED COEFFICIENTS

1104
IN A CRC CIRCUIT CONVERSION UNIT, UTILIZING AT LEAST THE PLURALITY OF ADJUSTED COEFFICIENTS TO PROVIDE A PLURALITY OF CRC REMAINDER COEFFICIENTS FOR THE n+m BIT FRAME

EFFICIENT CRC REMAINDER COEFFICIENT GENERATION AND CHECKING DEVICE AND METHOD

This is a continuation of application Ser. No. 07/998,193, filed Dec. 29, 1992 and now abandoned.

FIELD OF THE INVENTION

This invention relates generally to digital communication error detection and, more particularly, to a cyclic redundancy checking (CRC) device and method for error-detection in a digital data communication system.

BACKGROUND

In a digital data communication system a receiver may receive transmitted data signals that contain errors. A number of factors, such as attenuation of signals, transmission line loss, magnetic field changes, and noise may cause such errors. Various error detection methods have been developed to check received digital data for errors. Linear systematic cyclic codes, commonly known as cyclic redundancy (CRC) codes are typically used to provide error detection capability at various network layers of modern data communications networks.

CRC remainder coefficient generation and checking devices are implemented both in hardware and in software. Typical hardware implementations use serial shifter register schemes wherein feedback shift registers perform a long division of polynomials one bit at a time. To improve throughput, octet algorithms that handle one 8 bit-byte at a time have been developed. These octet algorithms are realized in both hardware and software. However, error processing utilizing CRC computations has a high degree of computational complexity, and thus can have a significant impact on the performance or cost of a digital data communication system. For example, in one application, ⅓ of the processing available from a DSP56156 processor is consumed by CRC computation. Thus, there is a need for an efficient CRC computation device and method that reduces the complexity and processing requirements for CRC computation in a digital data communication system.

SUMMARY OF THE INVENTION

Described is a cyclic redundancy check (CRC) remainder coefficient generator, and a method for utilizing the generator, in a CRC circuit for generating a plurality of CRC remainder coefficients for an (n+m) bit frame utilizing a first input of data for a plurality of m coefficients representing a last m bits of an (n+m) bit frame (n, m are positive integers, m>1; K is a degree of a CRC generating polynomial) and a second input of data for a plurality of K previously calculated CRC remainder coefficients of a first n bits of the frame. The generator includes at least a CRC circuit combining unit and a CRC circuit conversion unit. The CRC circuit combining unit is operably coupled to receive a preselected portion of the first input data and a preselected portion of the second input data, and substantially performs bitwise modulo-two addition of the preselected portion of the first input data and the preselected portion of second input data to provide adjusted coefficients. The CRC circuit conversion unit is operably coupled at least to the CRC circuit combining unit, and comprises a plurality (more than one) of look-up tables and substantially at least a first EXCLUSIVE-OR circuit, for utilizing at least the plurality of adjusted coefficients to provide a plurality of CRC remainder coefficients for the (n+m) bit frame.

The method of the present invention implements the generator as described above, i.e., utilizing at least the CRC circuit combining unit and the CRC circuit conversion unit, to provide a plurality of CRC remainder coefficients for the (n+m) bit frame.

DETAILED DESCRIPTION OF A PREFERRED EMBODIMENT

The present invention is described below, with a description of its application to a digital transmission system in general. Then, special cases are described. A frame is a block of data that is transmitted or received in a digital data system.

Cyclic code error-detection methods typically divide a data message as a polynomial d(x) by a predetermined generating polynomial g(x) to provide a quotient polynomial q(x) and a remainder polynomial r(x) such that:

$$d(x)=q(x)*g(x)+r(x).$$

The remainder r(x) is the cyclic redundancy check (CRC) and may be, for example, 16 bits in length (two 8 bit bytes). The CRC is appended to the block of data to be transmitted, and the receiving device uses the same predefined generating polynomial to generate its own internally generated CRC based on the received message block, comparing the CRC it has generated with the transmitted CRC. If an error has occurred during transmission, the internally generated CRC does not match the transmitted CRC.

The CRC remainder coefficient generator of the present invention provides CRC remainder coefficients for efficient generation of a frame check sequence for a frame to be transmitted and for efficient cyclic redundancy check (CRC) error detection for a received digital signal frame in a digital communication system, typically by utilizing a system that includes multiple look-up tables having preselected precalculated CRC remainder coefficients. This minimizes actual computation time during CRC error-checking such that, where the present invention is combined with efficient encoding, the amount of time used for CRC computation is reduced by almost one-half for a software implementation. Significant savings can also be achieved with a hardware implementation.

The present invention may be applied to any K-bit CRC with any frame length, but is particularly efficient for 16-bit and 32-bit CRCs with frame length of 8n bits (n is a positive integer).

The present invention may be implemented to support a 16-bit CRC as specified in the CCITT (International Telegraph and Telephone Consultative Committee) X.25 recommendation. In addition, the present invention supports the 32-bit CRC specified in the ANSI/IEEE (American National Standards Institute/Institute of Electrical & Electronics Engineers, Inc.) 802.X standard.

First, with respect to the 32-bit CRC, the ANSI/IEEE Standard 802.X specifies that the Frame Check Sequence (FCS) is the one's complement of the remainder $$r(x)=Rem_{g(x)}\{x^i I(x)+x^{32} s_f(x)\}$$

where $g(x)=x^{32}+x^{26}+x^{23}+x^{22}+x^{16}+x^{12}+x^{11}+x^{10}+x^8+x^7+x^5+x^4+x^2+x+1$ is a generating polynomial, $I(x)=x^{31}+x^{30}+\ldots+x+1$ represents an initial remainder polynomial, i is a number of bits in the frame (not including the FCS), and $s_f(x)$ is a polynomial formed by contents of the frame.

The ANSI/IEEE 802.5 standard specifies that each octet of the frame is transmitted most significant bit first, and that the FCS be transmitted commencing with the coefficient of the highest term. The coefficient of the highest order term is the most significant bit of the first octet of the frame.

The basis for the present invention may be understood as follows:

Let g(x) be any CRC generating polynomial of degree K, s(x) be a polynomial of (n−1)th degree formed by the first n bits of the frame, and I(x) be a polynomial of (K−1)th degree formed by an initial remainder. Throughout the description of this invention, m, n and K are defined to be positive integers. Upon processing a first n bits of the frame, a remainder polynomial for the n bits is $$\begin{aligned} r(x) &= Rem_{g(x)}\{x^n I(x)+x^K s(x)\} \\ &= r_{K-1} x^{K-1} + r_{K-2} x^{K-2} + \ldots + r_1 x + r_0. \end{aligned}$$

where $r_{K-1}, r_{K-2}, \ldots, r_1, r_0$ are remainder coefficients. To find a remainder r'(x) for a first (n+m) bits of the frame, where $0 \leq m < K$, the polynomial s'(x) formed by the first (n+m) bits may be written as $$s'(x)=s(x)x^m+d(x)$$

where $d(x)=d_{m-1}x^{m-1}+d_{m-2}x^{m-2}+\ldots+d_1 x+d_0$ is a polynomial whose coefficients are from an m additional bits of the frame. Thus, the new remainder r'(x) is given by:

$$\begin{aligned} r'(x) &= Rem_{g(x)}\{x^{n+m} I(x)+x^K s'(x)\} \\ &= Rem_{g(x)}\{x^{n+m} I(x)+x^K[s(x)x^m+d(x)]\} \\ &= Rem_{g(x)}\{x^m[x^n I(x)+x^K s(x)]+x^K d(x)\}. \end{aligned}$$

Since $r(x)=Rem_{g(x)}\{x^n I(x)+x^K s(x)\}$, which means that $x^n I(x)+x^K s(x)=q(x)g(x)+r(x)$, where q(x) is the quotient polynomial, the above equations may be rewritten:

$$\begin{aligned} r'(x) &= Rem_{g(x)}\{x^m[q(x)g(x)+r(x)]+x^K d(x)\} \\ &= Rem_{g(x)}\{x^m q(x)g(x)+x^m r(x)+x^K d(x)\} \\ &= Rem_{g(x)}\{x^m q(x)g(x)\}+Rem_{g(x)}\{x^m r(x)+x^K d(x)\} \\ &= Rem_{g(x)}\{x^m r(x)+x^K d(x)\} \\ &= Rem_{g(x)}\{[r_{K-1}+d_{m-1}]x^{K+m-1}+\ldots+ \\ &\quad [r_{K-m}+d_0]x^K+r_{K-m-1}x^{K-1}+\ldots+r_1 x^m+r_0 x^{m-1}\} \\ &= Rem_{g(x)}\{[r_{K-1}+d_{m-1}]x^{K+m-1}+\ldots+ \\ &\quad [r_{K-m}+d_0]x^K\}+r_{K-m-1}x^{K-1}+\ldots+r_1 x^m+r_0 x^{m-1}. \end{aligned}$$

Thus, utilizing the above relationship for 0<m<K, the present invention provides for obtaining the new remainder coefficients for the first (n+m) bits from the previous remainder coefficients for the first n bits by:

1) bitwise modulo-two addition of the m new bits to the m coefficients of the m highest order terms of the previous remainder polynomial (i.e., $r_{K-1}+d_{m-1}$, $r_{K-2}+d_{m-2}, \ldots, r_{K-m}+d_0$);

2) determining coefficients of an intermediate remainder $$Rem_{g(x)}\{[r_{K-1}+d_{m-1}]x^{K+m-1}+\ldots+[r_{K-m}+d_0]x^K\}; \text{ and}$$

3) obtaining the new remainder coefficients by adding the (K−m) lowest order term coefficients of the previous remainder $r_{K-m-1}x^{K-1}+\ldots+r_1 x^{m+r}_0 x^{m-1}$ to the (K−m) highest order term coefficients of the intermediate remainder.

For m>K, r'(x) becomes:

$$\begin{aligned} r'(x) &= Rem_{g(x)}\{x^m r(x)+x^K d(x)\} \\ &= Rem_{g(x)}\{[r_{K-1}+d_{m-1}]x^{K+m-1}+\ldots+ \\ &\quad [r_0+d_{m-K}]x^m+d_{m-K-1}x^{m-1}+\ldots+d_0 x^K\} \end{aligned}$$

Figure 1:
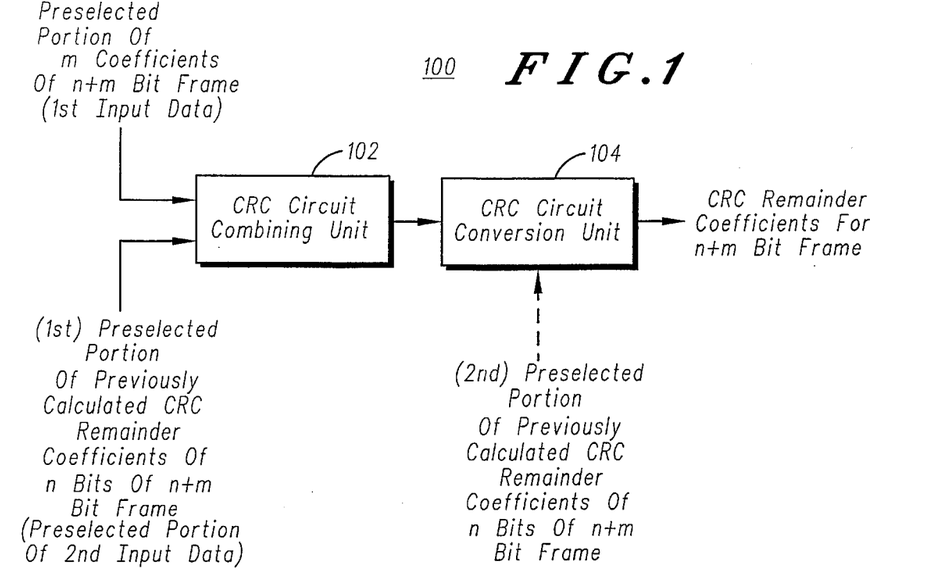
FIG. 1 is a block diagram of a cyclic redundancy check (CRC) remainder coefficient generator in a CRC circuit in accordance with the present invention.

Hence, for the case of m>K, a new remainder for the first (n+m) bits can be obtained from the m additional bits and a previous remainder of the first n bits by:

1. bitwise adding (modulo 2) the K bit previous remainder to the K coefficients of the K highest order terms of d(x); i.e., $r'_{K-1}+d_{m-2}, r_{K-2}+d_{m-2}, \ldots, r_0+d_{m-K}$; and
2. the new remainder r'(x) is then:

$\text{Rem}_{g(x)}\{[r_{K-1}+d_{m-1}]x^{K+m-1}+ \ldots +[r_0+d_{m-K}]x^m+d_{m-K-1}x^{m-1}+ \ldots +d_0 x^K\}$ FIG. 1, numeral 100, is a block diagram of a cyclic redundancy check (CRC) remainder coefficient generator in a CRC circuit in accordance with the present invention. The invention comprises two elements: a CRC circuit combining unit (102) and a CRC circuit conversion unit (104). The CRC circuit combining unit (102) combines data of a first input, a preselected portion of a last m coefficients of an (n+m) bit frame, with a preselected portion of the second input data that represents a preselected portion of previously calculated CRC remainder coefficients of a first n bits of the (n+m) bit frame to provide a plurality of adjusted coefficients. The CRC circuit combining unit (102) typically is an EXCLUSIVE-OR circuit (see FIG. 2, 208) that performs bitwise modulo-two addition on said inputs. The CRC circuit conversion unit (104) is operably coupled at least to the CRC circuit combining unit (102), and comprises at least one of A) a first look-up table, and B) a plurality (more than one) of look-up tables and substantially at least a first EXCLUSIVE-OR circuit, for utilizing at least the plurality of adjusted coefficients to provide a plurality of CRC remainder coefficients for the (n+m) bit frame. An EXCLUSIVE-OR circuit performs bitwise modulo-two addition. Selected implementations of the present invention are set forth below.

Figure 2:
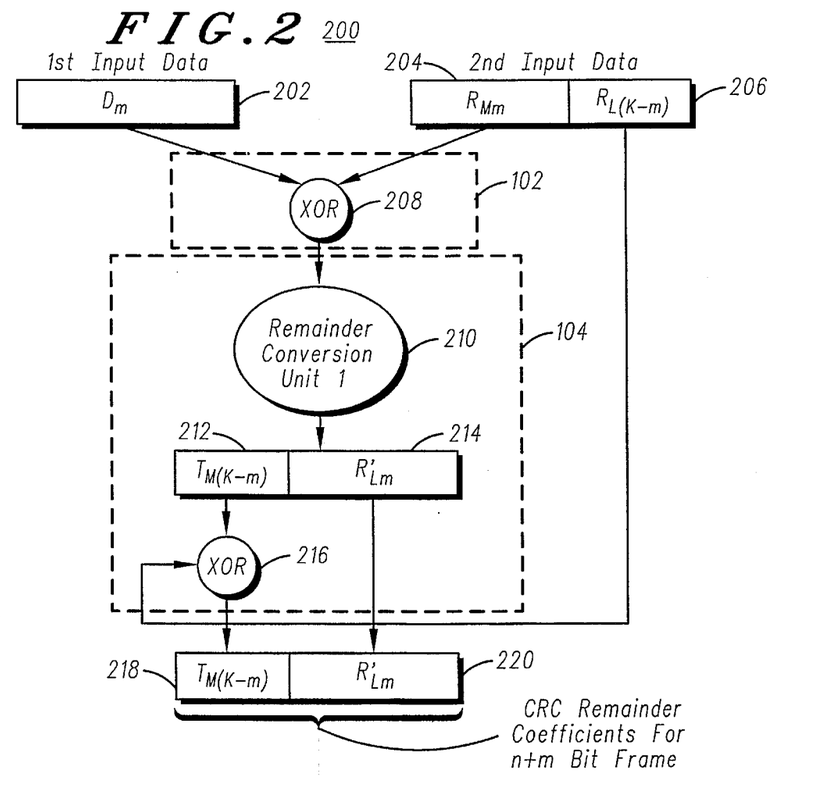
FIG. 2 is a block diagram of a first embodiment of a cyclic redundancy check (CRC) remainder coefficient generator in a CRC circuit in accordance with the present invention wherein K is a length of the CRC.
Figure 3:
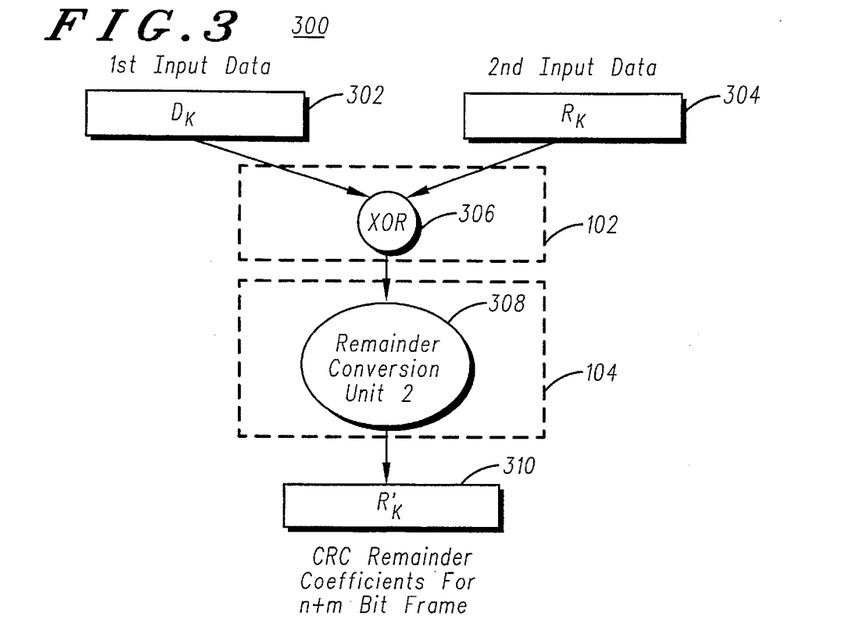
FIG. 3 is a block diagram of a second embodiment of a cyclic redundancy check (CRC) remainder coefficient generator in a CRC circuit in accordance with the present invention wherein m=K.

For example, FIG. 2, numeral 200, is a block diagram of a first embodiment of a cyclic redundancy check (CRC) remainder coefficient generator in a CRC circuit in accordance with the present invention wherein K is a length of the CRC. Here $D_m=[d_{m-1}, d_{m-2}, \ldots, d_1, d_0]$ (202) represents m coefficients of an (n+m) bit frame (i.e., m bits after the first n bits), $R_{Mm}=[r_{K-1}, r_{K-2}, \ldots, r_{K-m}]$ (204) represents a preselected portion of previously calculated CRC remainder coefficients of n bits of the (n+m) bit frame (here, m highest order remainder coefficients of the second input data, where m is greater than zero and less than or equal to K), and $R_{L(K-m)}=[r_{K-m-1}, r_{K-m-2}, \ldots, r_0]$ ((206) represents a second preselected portion of previously calculated CRC remainder coefficients of n bits of the (n+m) bit frame (here, (K-m) lowest order remainder coefficients of the second input data). In this implementation, the CRC circuit combining unit (102) includes an EXCLUSIVE-OR circuit (208) that performs bitwise modulo-two addition of $D_m$ (202) and $R_{Mm}$ (204)(m highest order coefficients of the previous remainder polynomial, where $1<m \leq K$) to provide (output) adjusted coefficients. The CRC conversion unit (104) in this implementation includes a Remainder Conversion Unit 1 (210) that typically includes one of A–B:

A) one memory look-up table of size $2^m$ by K, operably coupled to the CRC circuit combining unit (102), for utilizing the adjusted coefficients to output one of:

A1) all coefficients (FIG. 3 (310)) of the CRC intermediate remainder for the (n+m) bit frame, wherein each coefficient has been precomputed and stored in the memory look-up table; and A2) K coefficients (212, 214) of a CRC intermediate remainder (212, 214) comprising K–m highest order coefficients (212) of the CRC intermediate remainder and m lowest order coefficients (214) of the CRC intermediate remainder that are m lowest order coefficients of the CRC remainder for the (n+m) bit frame, wherein each coefficient has been precomputed and stored in the memory look-up table; and B) j memory look-up tables (1<j<m; j is a positive integer) of size $2^b$ by K (where jb=m), operably coupled to the CRC circuit combining unit (102), for utilizing the adjusted coefficients to output all coefficients (212, 214) of the CRC intermediate remainder for the (n+m) bit frame, wherein each coefficient has been precomputed and stored in one of the j memory look-up tables.

The Remainder Conversion Unit 1 (210) utilizes adjusted coefficients to provide intermediate remainder coefficients (TM(K–m), (K–m) highest order coefficients of the intermediate remainder (212); $R'_{Lm}$, m lowest order coefficients of the intermediate remainder (214)). The adjusted coefficients are $[r_{K-1}+d_{m-1}], [r_{K-2}+d_{m-2}], \ldots, [r_{K-m}+d_0]$ for the remainder terms $x^{K+m-1}, x^{K+m-2}, \ldots, x^K$, respectively. The CRC conversion unit (104) further includes an EXCLUSIVE-OR circuit (216) that performs bitwise modulo-two addition of $T_{M(K-m)}$ (212) (the highest order coefficients of the intermediate remainder)and $R_{L(K-m)}$ (214) (the lowest order coefficients of the previous remainder (for n bits) $r_{K-m-1}x^{K-1}+ \ldots +r_1 x^m + r_0 x^{m-1}$) to provide $R'_{M(K-m)}$ (218) (the highest order coefficients of the CRC remainder for the (n+m) bit frame), typically to a memory register. The Remainder Conversion Unit 1 (210) also provides $R'_{Lm}$ (220) (the lowest order coefficients of the CRC remainder for the (n+m) bit frame), typically to a memory register. These two outputs, $R'_{M(K-m)}$ (218) and $R'_{Lm}$ (220), represent all the coefficients of the CRC remainder for the (n+m) bit frame. Where selected, the CRC remainder coefficients for the (n+m) frame may be stored as a set of bits in a memory register.

FIG. 3, numeral 300, is a block diagram of a second embodiment of a cyclic redundancy check (CRC) remainder coefficient generator in a CRC circuit in accordance with the present invention wherein m=K. Here, the remainder for an (n+m) bit frame, where m=K, is calculated K bits at a time, significantly saving in CRC remainder generation time. In this implementation, $D_m=D_K=[d_{K-1}, d_{K-2}, \ldots, d_1, d_0]$ (302) represents m=K coefficients of an (n+m) bit frame (i.e., m bits after the first n bits), $R_K=[r_{K-1}, r_{K-2}, \ldots, r_0]$ (304) represents all of the previously calculated CRC remainder coefficients of n bits of the (n+m) bit frame or, identically, all of the remainder coefficients of the second input data. In this implementation, the CRC circuit combining unit (102) includes an EXCLUSIVE-OR circuit (306) that performs bitwise modulo-two addition of $D_K$ (302)and $R_K$ (304) to provide adjusted coefficients to the CRC conversion unit (104). The CRC conversion unit (104) in this implementation includes a Remainder Conversion Unit 2 (308) that typically includes one of:

one memory look-up table of size $2^K$ by K, operably coupled to the CRC circuit combining unit (102), for utilizing the adjusted coefficients to output all coefficients ($R'_K$, 310) of the CRC intermediate remainder for the (n+m) bit frame, wherein each coefficient has been precomputed and stored in the memory look-up table; and j memory look-up tables (j<K; j is a positive integer) of size $2^b$ by K (where jb=K), operably coupled to the CRC circuit combining unit (102), for utilizing the adjusted coefficients to output all coefficients ($R'_K$, 310) of the CRC intermediate remainder for the (n+m) bit frame, wherein each coefficient has been precomputed and stored in one of the j memory look-up tables.

In the special case of the second implementation, the coefficients of the CRC intermediate remainder are simply the coefficients of the CRC remainder for the (n+K) bit frame. Thus, the Remainder Conversion Unit 2 (308) provides intermediate remainder coefficients $R'K=[r_{K-1}+d_{K-1}], [r_{K-2}+d_{K-2}], \ldots, [r_0+d_0]$ that represent all of the coefficients for the CRC remainder for the n+K bit frame. Note that this implementation does not require a second EXCLUSIVE-OR circuit, as was utilized in the first implementation, thus saving on circuit complexity or computation time.

Thus, it is clear that the remainder conversion unit (RCU) may be implemented in a number of ways. Where the remainder conversion unit utilizes only one memory look-up table of size $2^m$ by K to store precomputed intermediate remainder coefficients, a fastest implementation is achieved. However, where m is large (for example, m=K), such a look-up table would require a large memory space consumption, On the other extreme, the RCU can be implemented by using m precomputed tables of size 1 by K, which will require (m−1) additional K-bit EXCLUSIVE-OR operations, significantly lowering conversion speed of the RCU. Generally, it is possible to trade-off some speed with memory space consumption in an implementation that utilizes j memory look-up tables of size $2^b$ by K, where jb=m, as is set forth in FIG. 4.

Figure 4:
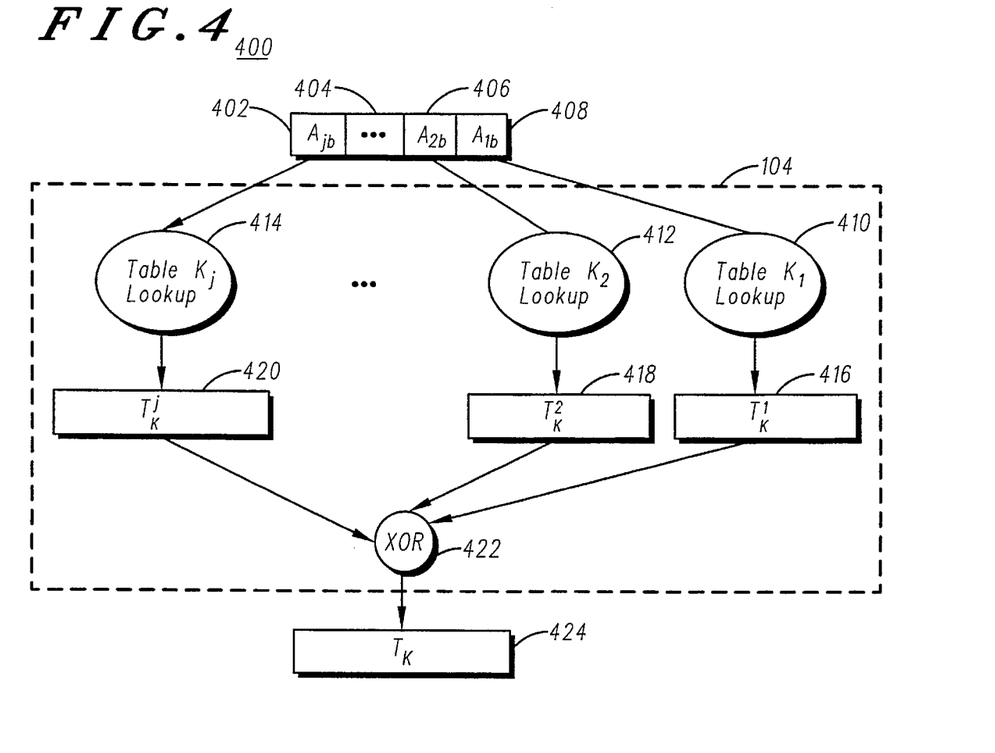
FIG. 4 is a block diagram of an embodiment of a remainder conversion unit (RCU) in accordance with the present invention, wherein m=bj and where b and j are a positive integers.

FIG. 4, numeral 400, is a block diagram of an embodiment of a remainder conversion unit (RCU) in accordance with the present invention, wherein m=bj and where b is a positive integer, typically 8, and j is a positive integer. In this implementation, the RCU includes j memory look-up tables (Table $K_1$ Lookup (410), Table $K_2$ Lookup (412), ..., Table $K_j$ Lookup (414)) of size $2^b$ by K that are operably coupled to the CRC circuit combining unit (102), and an EXCLUSIVE-OR circuit (422) that is operably coupled to the memory look-up tables. The adjusted coefficients from the CRC circuit combining unit (102) are utilized by the j memory look-up tables (Table $K_1$Lookup (410), Table $K_2$ Lookup (412), ..., Table $K_j$ Lookup(414)), to output, typically to memory registers, j sets $T_K^1$(416), $T_K^2$ (418), ..., $T_K^j$ (420), each having K bits, of precomputed intermediate remainder coefficients, which, bitwise modulo-two summed (i.e., EXCLUSIVE-ORed) together (j−1) times, are all coefficients of the CRC intermediate remainder for the (n+m) bit frame, wherein each coefficient has been precomputed and stored in one of the j memory look-up tables.

Hence, in the FIG. 4 RCU implementation, the intermediate CRC remainder may be rewritten as (i.e., the formula for generating the tables of coefficients):

$Rem_{g(x)}\{[r_{K-1} + d_{m-1}]x^{K+m-1} + \ldots + [r_{K-m} + d_0]x^K\} =$ $Rem_{g(x)}\{[r_{K-1} + d_{m-1}]x^{K+m-1} + \ldots + [r_{K-b} + d_{m-b}]x^{K+m-b}\}$ $Rem_{g(x)}\{[r_{K-b-1} + d_{m-b-1}]x^{K+m-b-1} + \ldots +$ $[r_{K-2b-m} + d_{m-2b}]x^{K+m-2b}\} + \ldots +$ $Rem_{g(x)}\{[r_{K-(j-1)b-1} + d_{m-(j-1)-1}]x^{K+m-(j-1)-1} + \ldots +$ $[r_{K-jb} + d_0]x^K\}$ Thus, in general, each of j terms of the the above equation calculates a remainder of a polynomial of degree [K+m−(j−1) b−1] whose all but b highest order terms are zeros. Thus, where m=jb, the m bits are partitioned into j segments $A_{1b}$ (408), $A_{2b}$ (406), ... (404), $A_{jb}$ (402), of b bits each, and each segment is used as an address for a memory look-up table of coefficients. Each table of coefficients is precomputed and prestored for each of the j intermediate remainder terms, each table containing $2^b$ entries, and each entry consisting of K coefficients of the intermediate remainder of such polynomial of degree [K+m−(j−1)b−1] with a particular combination of b highest order coefficient terms (all other terms must be zero by definition).

For applications where the word lengths are shorter than K, each entry of the table occupies more than one memory location. For example, for a 32-bit CRC determination, if the word length of the device is 16, then each table entry requires 2 memory locations and $2^{b+1}$ memory words for each lookup table. Depending on the architecture and addressing mode of the device, each lookup table may be organized as $2^b$ entries with each entry occupying two consecutive 16-bit words. Alternatively, each lookup table may be organized as two halves, where the upper half table contains the $2^b$ upper word of every entry and the lower half table contains the $2^b$ lower word of every table entry.

In this implementation, the CRC circuit combining unit (102) includes an EXCLUSIVE-OR circuit (422), operably coupled to receive the j memory register (416, 418, ..., 420) outputs, that performs bitwise modulo-two addition of all j look-up table coefficients, $T_K^1$(416), $T_K^2$(418), ..., $T_K^{j(420)}$ to provide all ($T_K$, 424) of the the coefficients of the intermediate remainder.

Figure 5:
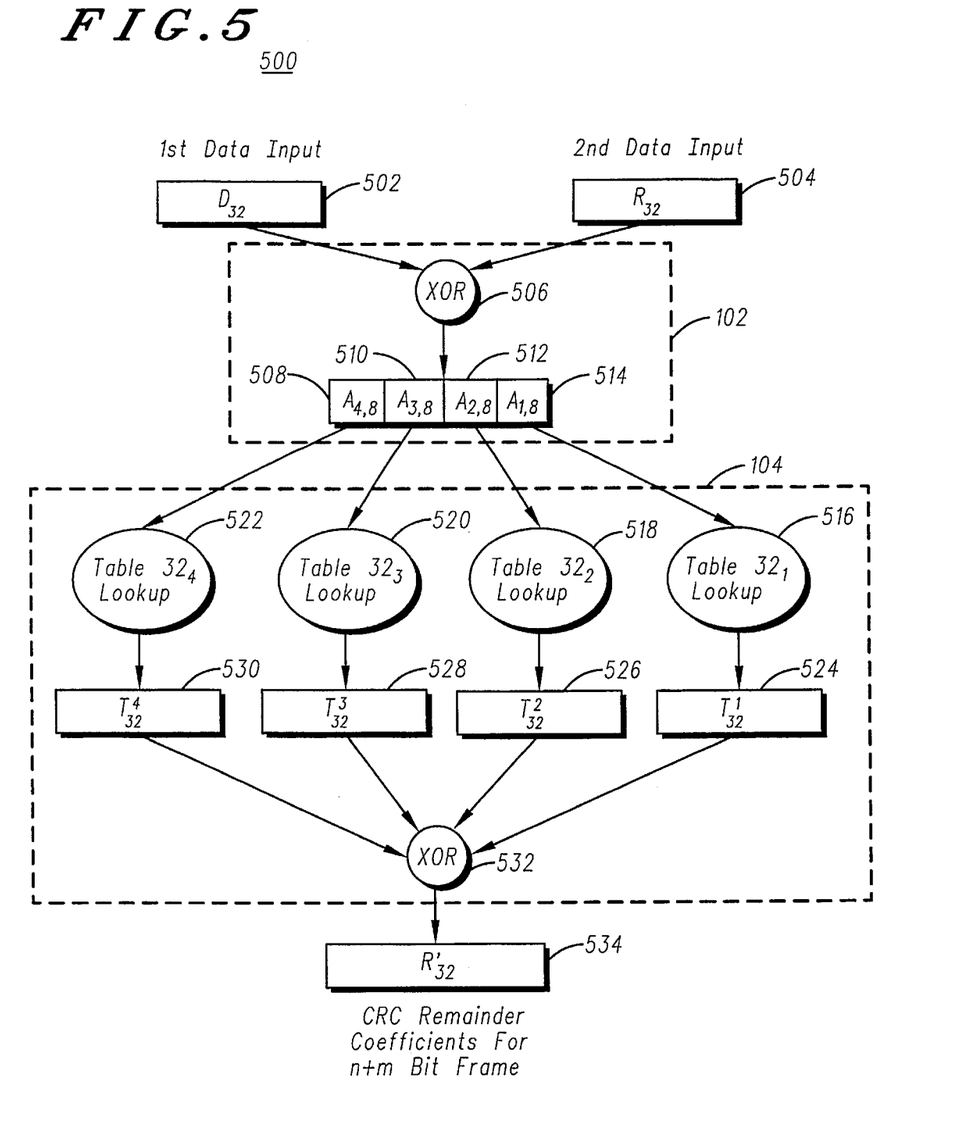
FIG. 5 is a block diagram of a fourth embodiment of a cyclic redundancy check (CRC) remainder coefficient generator in a CRC circuit in accordance with the present invention wherein m=K=32, j=4, and b=8.

FIG. 5, numeral 500, is a block diagram of a fourth embodiment of a cyclic redundancy check (CRC) remainder coefficient generator in a CRC circuit in accordance with the present invention wherein m=K=32, j=4, and b=8. This implementation is well-suited to a 32-bit device. Where $D_{32=[d31}, d_{30}, \ldots, d_1, d_0]$ (502) represents 32 coefficients of an (n+32) bit frame (i.e., 32 bits after the first n bits), $R_{32}=[r_{31}, r_{K=2}, \ldots, r_0]$ (504) represents a preselected portion of previously calculated CRC remainder coefficients of 32 bits of the n bit frame (here, 32 highest order remainder coefficients (i.e., all) of the second input data). In this implementation, the CRC circuit combining unit (102) includes an EXCLUSIVE-OR circuit (506) that performs bitwise modulo-two addition of $D_{32}$ (502) and $R_{32}$ (504) to provide (output) adjusted coefficients, which, in this implementation, are partitioned into four segments $A_{1,8}$ (514), $A_{2,8}$ (512), $A_{3,8}$ (510), $A_{4,8}$ (508), of 8 bits each, and each segment is used as an address for a memory look-up table of coefficients of the CRC circuit conversion unit (104): Table $32_1$ Lookup (516), Table $32_2$ Lookup (518), Table $32_3$ Lookup (520), and Table $32_4$ Lookup (522), respectively. Each table of coefficients is precomputed and prestored for each of the 4 intermediate remainder terms, each table containing $2^8$ entries, and each entry consisting of 32 adjusted coefficients of the intermediate remainder of such polynomial of degree [K+m−(j−1)b−1] with a particular combination of 8 highest order coefficient terms (all other terms must be zero by definition). Each look-up table (Table $32_1$ Lookup (516), Table $32_2$ Lookup (518), Table $32_3$ Lookup (520), and Table $32_4$ Lookup (522)) of the RCU (104) is operably coupled to a memory register ($T_{32}^1$, (524); $T_{32}^2$, (526); $T_{32}^3$, (528); $T_{32}^4$, (530)) (102) for storing the entries in the memory registers.

The CRC conversion unit (104) further includes an EXCLUSIVE-OR circuit (532) that performs bitwise modulo-two addition of $T_{32}^1$ (524), $T_{32}^2$ (526), $T_{32}^3$ (528), $T_{32}^4$ (530) to provide $R'_{32}$ (534), all the coefficients of the CRC remainder for the (n+m) bit frame. Where selected, the CRC remainder coefficients for the (n+m) frame may be stored as a set of bits in a memory register.

Figure 6:
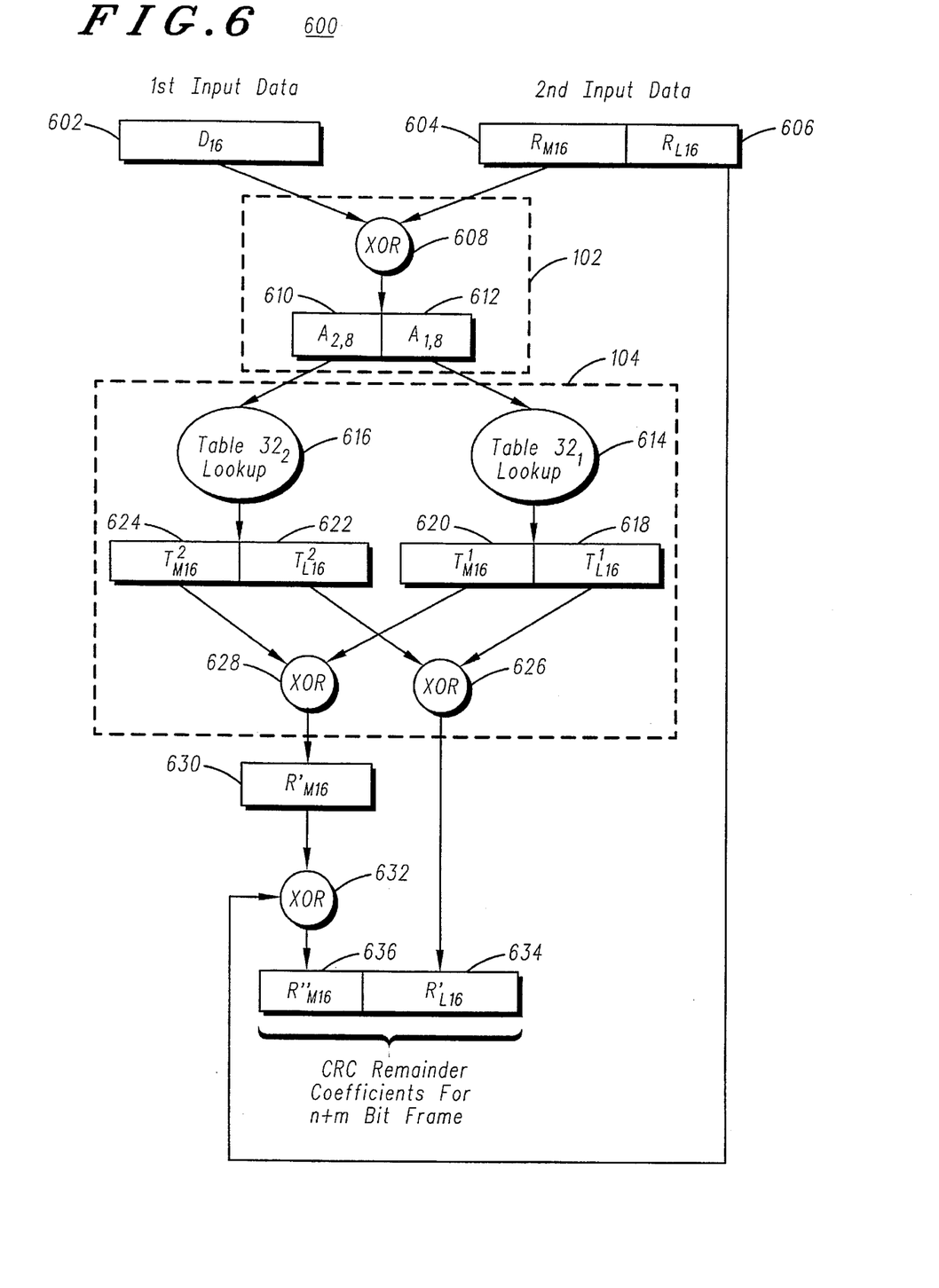
FIG. 6 is a block diagram of a fifth embodiment of a cyclic redundancy check (CRC) remainder coefficient generator in a CRC circuit in accordance with the present invention wherein K=32, m=16, j=2, and b=8.

FIG. 6, numeral 600, is a block diagram of a fifth embodiment of a cyclic redundancy check (CRC) remainder coefficient generator in a CRC circuit in accordance with the present invention wherein K=32, m=16, j=2, and b=8. This implementation is well-suited to a 16-bit processing device. Here $D_m=D_{16}=[d_{15}, d_{14}, \ldots, d_1, d_0]$ (602) represents 16 coefficients of an (n+16) bit frame (i.e., 16 bits after the first n bits), $R_{M16}=[r_{31}, r_{30}, \ldots, r_{16}]$ (604) represents a preselected portion of previously calculated CRC remainder coefficients of n bits of the (n+16) bit frame (here, 16 highest order remainder coefficients of the second input data), and $R_{L16}=[r_{K15}, r_{14}, \ldots, r_0]$ ((606)) represents a second preselected portion of previously calculated CRC remainder coefficients of n bits of the (n+16) bit frame (here, a (16) lowest order remainder coefficients of the second input data).

In this implementation, the CRC circuit combining unit (102) includes an EXCLUSIVE-OR circuit (608) that performs bitwise modulo-two addition of $D_{16}$ (602) and $R_{M16}$ (604) to provide (output) adjusted coefficients, which, in this implementation, are partitioned into two segments, $A_{1,8}$ (612) and $A_{2,8}$ (610), of 8 bits each, and each segment is used as an address for a memory look-up table of coefficients of the CRC circuit conversion unit (104): Table $32_1$ Lookup (614) and Table $32_2$ Lookup (616), respectively. Each table (of which there are two) of coefficients is precomputed and prestored for each of the 2 intermediate remainder terms, each table containing $2^8$ entries, each entry consisting of 32 adjusted coefficients of the intermediate remainder. Each table (Table $32_1$ Lookup (614) and Table $32_2$ Lookup (616)) provides 32 bit intermediate remainder coefficients for a separate intermediate remainder, wherein the coefficients from each table are partitioned into two segments, one segment having 16 highest order remainder coefficients ($T^1_{M16}$ (620); $T^2_{M16}$ (624)) and the other segment having 16 lowest order remainder coefficients ($T^1_{L16}$ (618); $T^2_{L16}$ (622)). Thus, each look-up table (Table $32_1$ Lookup (614) and Table $32_2$ Lookup (616)) of the RCU (104) is operably coupled to a memory register that is partitioned to provide two 16 bit entries ($T^1_{L16}$ (618) and $T^1_{M16}$ (620), and $T^2_{L16}$ (622) and $T^2_{M16}$ (624)) for storing the entries in the memory registers.

In FIG. 6, the CRC conversion unit (104) includes a second EXCLUSIVE-OR circuit that includes a first (626) and a second (628) intermediate EXCLUSIVE-OR circuit, the first (626) being operably coupled to memory registers for $T^1_{L16}$ (618) and $T^2_{L16}$ (622), and the second (628) being operably coupled to memory registers for $T^1_{M16}$ (620) and $T^2_{M16}$ (624), respectively, that perform bitwise modulo-two addition of $\{T^1_{L16}$ (618) and $T^2_{L16}$ (622)$\}$, and on $\{T^1_{M16}$ (620), $T^2_{M16}$ (624)$\}$ respectively to provide two 16 bit coefficient (highest (630) and lowest (634)) sets to a memory register unit (($R'_{L16}$ (634); $R'_{M16}$ (630)). A third intermediate EXCLUSIVE-OR circuit (632), operably coupled to memory register unit having the 16 highest order coefficients (630) of the second EXCLUSIVE-OR circuit and to the memory register for $R_{L16}$ (606), performs bitwise modulo-two addition on $R'_{M16}$ (630) and $R_{L16}$ (606) to provide coefficients $R''_{M16}$ (636) (higher coefficients) that together with $R'_{L16}$ (634) (lower coefficients) represent CRC remainder coefficients for the (n+m) bit frame. Where selected, the CRC remainder coefficients for the (n+m) frame may be stored in a memory register.

According to the definition of the ANSI/IEEE 802.3/Ethernet, the frame check sequence is based on the same CRC generating polynomial as that of IEEE/ANSI 802.5, but the order of transmission and bits arrangement are different. However, utilizing a similar derivation, it is clear that for the ANSI/IEEE 802.3/Ethernet CRC, FIGS. 1 through 6 stay the same if m is restricted to be 8, 16, 24, or 32, with slightly different definitions for $D_8$, $D_{16}$, $D_{24}$, $D_{32}$, $R_{32}$, $R'_{32}$, and $T^j_{32}$'s etc.:

$D_8=[d_7, d_6, \ldots, d_0]$ $D_{16}=[d_7, d_6, \ldots, d_0, d_{15}, d_{14}, \ldots, d_8]$ $D_{24}=[d_7, d_6, \ldots, d_0, d_{15}, d_{14}, \ldots, d_8, d_{23}, d_{22}, \ldots, d_{16}]$ $D_{32}=[d_7, d_6, \ldots, d_0, d_{15}, d_{14}, \ldots, d_8, d_{23}, d_{22}, \ldots, d_{16}, d_{31}, d_{30}, \ldots, d_{24}]$ $R_{32}=[r_7, r_6, \ldots, r_0, r_{15}, r_{14}, \ldots, r_8, r_{23}, r_{22}, \ldots, r_{16}, r_{31}, r_{30}, \ldots, r_{24}]$ $R'_{32}=[r'_7, r'_6, \ldots, r'_0, r'_{15}, r'_{14}, \ldots, r'_8, r'_{23}, r'_{22}, \ldots, r'_{16}, r'_{31}, r'_{30}, \ldots, r'_{24}]$ $T^j_{32}=[t^j_7, t^j_6, \ldots, t^j_0, t^j_{15}, t^j_{14}, \ldots, t^j_8, t^j_{23}, t^j_{22}, \ldots, t^j_{16}, t^j_{31}, t^j_{30}, \ldots, t^j_{24}]$ where $1 \leq j \leq 4$ and the $d_i$'s, $r_i$'s, $r'_i$'s, $t^j_i$'s are the coefficients of $d(x)=d_{m-1}+d_{m-2}x+d_{m-3}x^2+\ldots, +d_1x^{m-2}+d_0x^{m-1}$ $r(x)=r_{31}+r_{30}x+r_{29}x^2+\ldots +r_1x^{30}+r_0x^{31}$ $r'(x)=r'_{31}+r'_{30}x+r'_{29}x^2+\ldots +r'_1x^{30}+r'_0x^{31}$ $t^j(x)=\text{Rem}_{g(x)}\{[a_7+a_6x+\ldots +a_0x^7]x^{32+(j-1)8}\}=t^j_{32}+t^j_{30}x+t^j_{29}x^2+\ldots +t^j_1x^{30}+t^j_0x^{31}$ and $a_0, a_1, \ldots, a_7$ are any combination of 1's and 0's.

Figure 7:
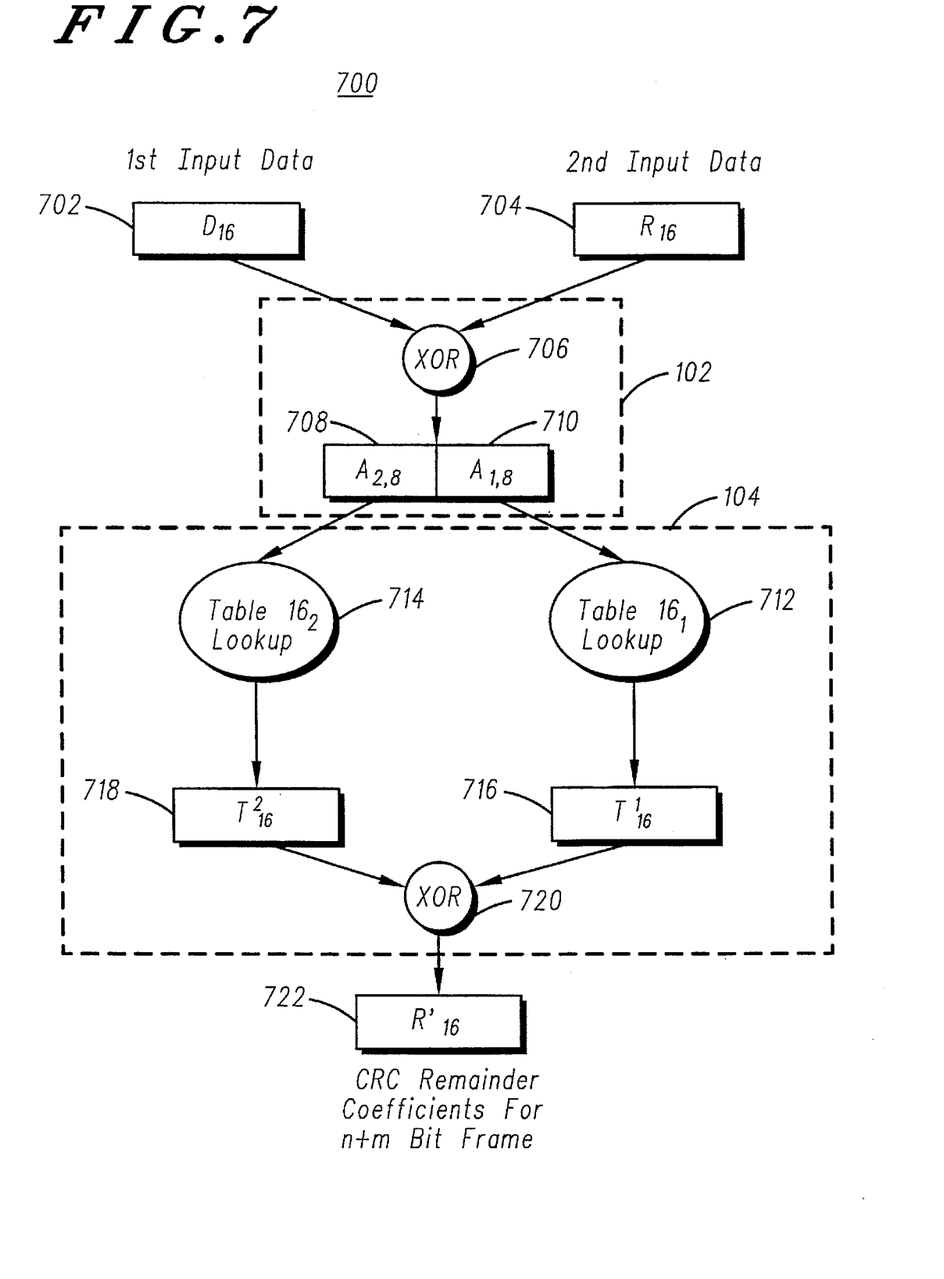
FIG. 7 is a block diagram of a seventh embodiment of a cyclic redundancy check (CRC) remainder coefficient generator in a CRC circuit in accordance with the present invention wherein m=K=16, j=2, and b=8.

FIG. 7, numeral 700, is a block diagram of a seventh embodiment of a cyclic redundancy check (CRC) remainder coefficient generator in a CRC circuit in accordance with the present invention wherein m=K=16, j=2, and b=8. This implementation is similar to that in FIG. 5. The order of bits is similar to that of ANSI/IEEE 802.3/Ethernet. Here $D_m=D_{16}=[d_7, d_6, \ldots, d_1, d_0, d_{16}, d_{14}, \ldots, d_8]$ (702), $R_{16}=[r_7, r_6, \ldots, r_0, r_{15}, r_{14}, \ldots, r_8]$ (704), and $R'16=[r'_7, r'_6, \ldots, r'_0, r'_{15}, r'_{14}, \ldots, r'_8]$ (722). That is, the two octets of $D_{16}$, $R_{16}$, and $R'_{16}$ are swapped. Actually, for memory organized as 16-bit word units, an X.25 frame is stored in exactly the same order shown given by $D_{16}$. The bit ordering reversal is solved utilizing the following equations to generate the two look-up tables, Table $16_1$ (712) and Table $16_2$ (714):

$$t_1(x) = \text{Rem}_{g(x)}\{x^{16}[(r_{15}+d_{15})+(r_{14}+d_{14})x^1+\ldots+(r_8+d_8)x^7]\}$$
$$= t_{1,15}+t_{1,14}x+\ldots+t_{1,8}x^7+t_{1,7}x^8+t_{1,6}x^9+\ldots+t_{1,0}x^{15}$$

$$t_2(x) = \text{Rem}_{g(x)}\{x^{16}[(r_7+d_7)x^8+(r_6+d_6)x^9+\ldots+(r_0+d_0)x^{15}]\}$$
$$= t_{2,15}+t_{2,14}x+\ldots+t_{2,8}x^7+t_{2,7}x^8+t_{2,6}x^9+\ldots+t_{2,0}x^{15}$$

$t_1(x)$ is utilized to generate the coefficients of Table $16_1$ (712), $t_2(x)$ is utilized to generate the coefficients of Table $16_2$ (714), and the coefficients are stored in the following order:

$[t_1, 7, t_1, 6, \ldots, t_1, 0, t_1, 15, t_1, 14, \ldots t_1, 8]$ and $[t_2, 7, t_2, 6, \ldots, t_2, 0, t_2, 15, t_2, 14, \ldots, t_2, 8]$.

Thus, in real-time remainder calculation, no additional time is required.

For frames containing an odd integer number of octets, the last octet of the frame has to be treated differently for CRC remainder generation if the rest of the frames are processed 16 bits at a time. Calculation of the CRC remainder 8 bits at a time is a known technique and may be implemented together with the present invention for processing a last byte of a frame where the frame has an odd number of bytes. However, for completeness, it is shown here. Letting m=8 and $d(x)=d_7+d_6x+\ldots+r_0x^7$:

$$r'(x) = \text{Rem}_{g(x)}\{x^{n+8}I(x)+x^{16}s'(x)\}$$
$$= \text{Rem}_{g(x)}\{x^{n+8}I(x)+x^{16}[s(x)x^8+d(x)]\}$$
$$= \text{Rem}_{g(x)}\{x^8[I(x)x^n+x^{16}s(x)]+x^{16}d(x)\}$$
$$= \text{Rem}_{g(x)}\{x^8r(x)+x^{16}d(x)\}$$
$$= \text{Rem}_{g(x)}\{(r_7+d_7)x^{16}+(r_6+d_6)x^{17}+\ldots+$$
$$(r_0+d_0)x^{23}\}+r_{15}x^8+r_{14}x^9+\ldots+r_8x^{15}.$$

In this implementation, the CRC circuit combining unit (102) includes an EXCLUSIVE-OR circuit (706) that performs bitwise modulo-two addition of $D_{16}$ (702) and $R_{16}$ (704) to provide (output) adjusted coefficients, which, in this implementation, are partitioned into two segments, $A_{1,8}$ (710) and $A_{2,8}$ (708), of 8 bits each, and each segment is used as an address for a memory look-up table of coefficients of the CRC circuit conversion unit (104): Table $16_1$ Lookup (712) and Table $16_2$ Lookup (714), respectively. Each table (of which there are two) of coefficients is precomputed and prestored for each of the 2 intermediate remainder terms, each table containing $2^8$ entries, each entry consisting of 16 adjusted coefficients of the intermediate remainder. Each table (Table $16_1$ Lookup (712) and Table $16_2$ Lookup (714)) provides 16 bit intermediate remainder coefficients ($T^1_{16}$ (716) and $T^2_{16}$ (718)) for a separate intermediate remainder. Each look-up table (Table $16_1$ Lookup (712) and Table $16_2$ Lookup (718)) of the CRC circuit conversion unit (104) is operably coupled to a memory register that is partitioned to provide two 16 bit entries ($T^1_{16}$, (716) and $T^2_{16}$, (718) for storing the entries in the memory registers.

In FIG. 7, the CRC circuit conversion unit (104) further includes an EXCLUSIVE-OR circuit (720) that performs bitwise modulo-two addition of $T^1_{16}$ (716) and $T^2_{16}$ (718) to provide a 16 bit set ($R'_{16}$ (722) of coefficients that together represent CRC remainder coefficients for the (n+16) bit frame. Where selected, the CRC remainder coefficients for the (n+16) frame may be stored in a memory register.

Thus, FIG. 7 illustrates a very fast generation for the FCS of a frame based on a 16-bit CRC on a 16-bit device, while utilized a reasonable amount of memory (for two 256-by-16 look-up tables). Similarly, FIG. 6 illustrates a very fast generation of a FCS of a frame for a 32-bit CRC on a 16 bit device with reasonable amount of memory (for two 256-by-32 look-up tables). Of course, the fastest way to generate the 32-bit CRC remainder is to use a 32 bit device with 1024-by-32 bit memory with the implementation shown in FIG. 5.

Figure 8:
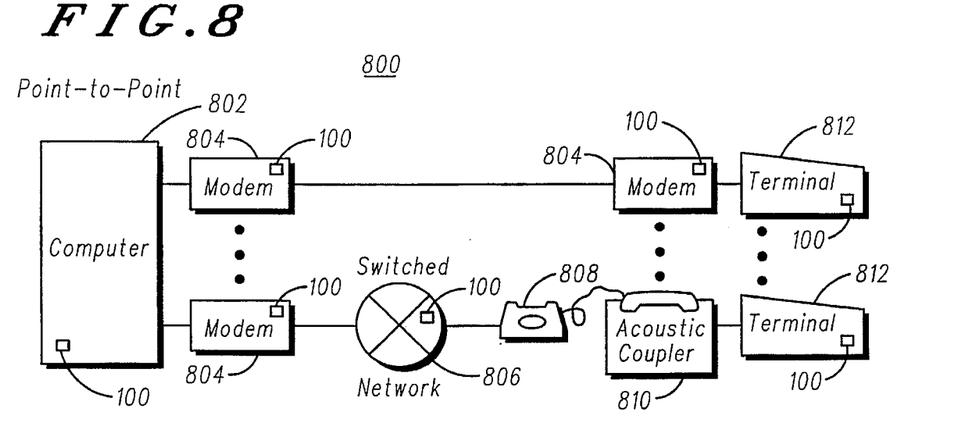
FIG. 8 is a block diagram of a point-to-point communication network system utilizing a cyclic redundancy check (CRC) remainder coefficient generator in a CRC circuit in accordance with the present invention.

FIG. 8, numeral 800, is a block diagram of a point-to-point communication network system utilizing a cyclic redundancy check (CRC) remainder coefficient generator in a CRC circuit in accordance with the present invention. The point-to-point communication network system includes a computer (802), operably coupled to selected modems (804, . . .), wherein at least one modem is further coupled to another modem that is coupled to a terminal (806), and at least one modem is coupled to a switched network (806) that is coupled to an acoustic device (such as a telephone) (808). The acoustic device is coupled to an acoustic coupler (810) that is coupled to a further terminal. Any of: the computer (802), modems (804, . . .), switched network (806), and terminals (812, . . .) in this system may be selected to include the cyclic redundancy check remainder coefficient generator of the present invention (100). Since the point-to-point communication network system, not including the present invention, is known in the art, it will not be further described here.

Figure 9:
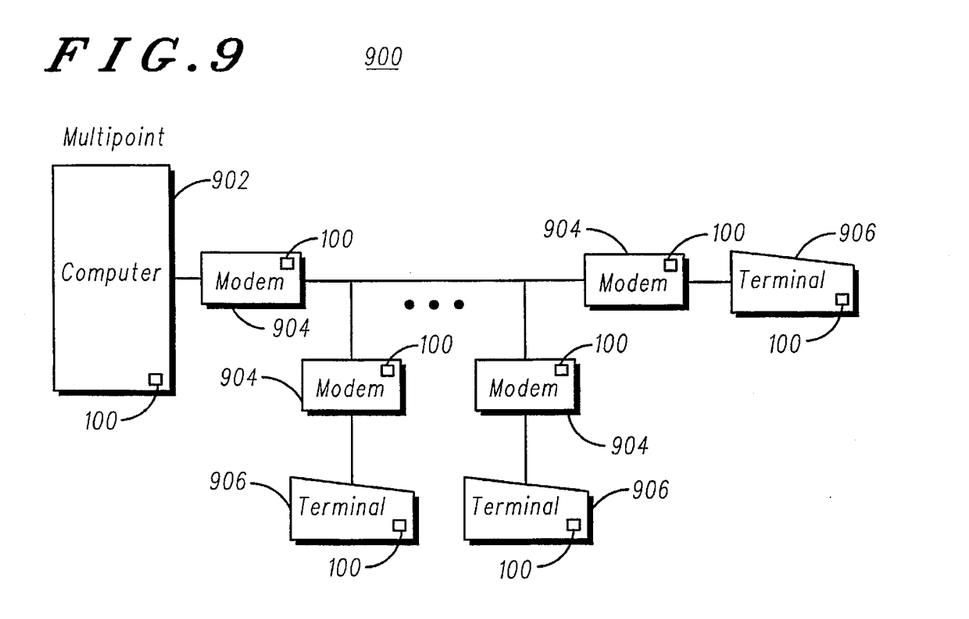
FIG. 9 is a block diagram of a multipoint communication network system utilizing a cyclic redundancy check (CRC) remainder coefficient generator in a CRC circuit in accordance with the present invention.

FIG. 9, numeral 900, is a block diagram of a multipoint communication network system utilizing a cyclic redundancy check (CRC) remainder coefficient generator in a CRC circuit in accordance with the present invention. The multipoint communication network system includes a computer (902), operably coupled to selected modems (904, . . .), wherein at least one modem is further coupled to a plurality of other modems, each further modem being further coupled to a terminal (906). Any of: the computer (902), modems (904, . . .), and terminals (912, . . .) in this system may be selected to include the cyclic redundancy check remainder coefficient generator of the present invention (100). Since the multipoint communication network system, not including the present invention, is known in the art, it will not be further described here.

Figure 10:
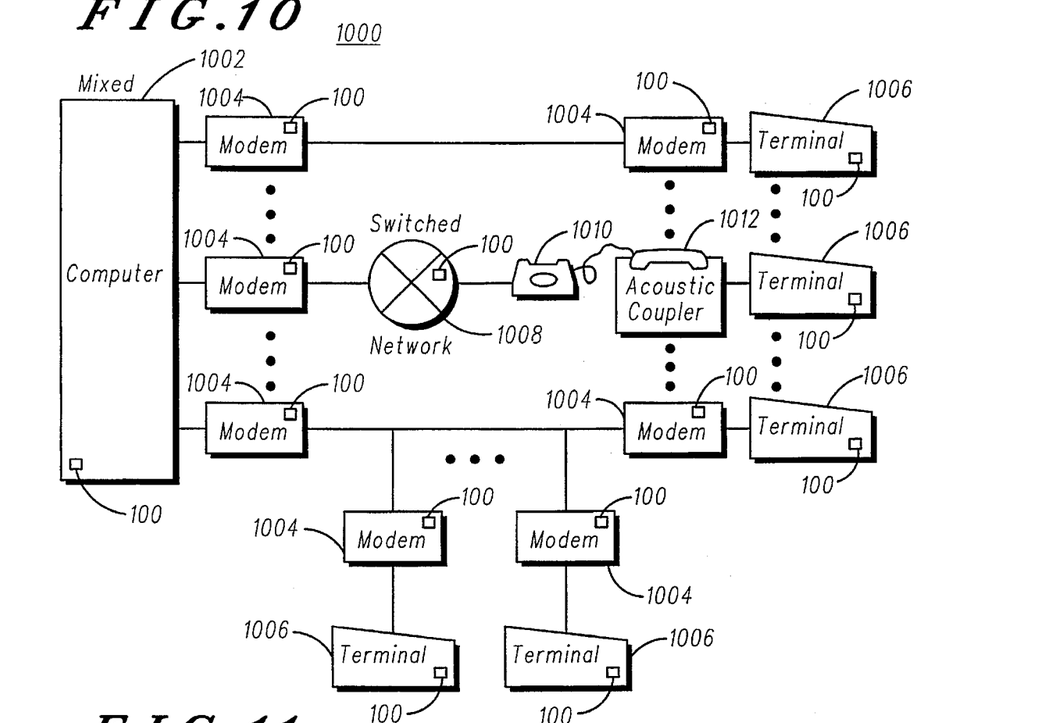
FIG. 10 is a block diagram of a mixed communication network system utilizing a cyclic redundancy check (CRC) remainder coefficient generator in a CRC circuit in accordance with the present invention.

FIG. 10, numeral 1000, is a block diagram of a mixed communication network system utilizing a cyclic redundancy check (CRC) remainder coefficient generator in a CRC circuit in accordance with the present invention. The mixed (i.e., including point-to-point and multipoint) communication network system includes a computer (1002), operably coupled to selected modems (1004, . . .), wherein at least one modem is further coupled to another modem that is coupled to a terminal (1006), wherein at least one modem is further coupled to a plurality of other modems, each further modem being further coupled to a terminal (1006) and at least one modem is coupled to a switched network (1006) that is coupled to an acoustic device (such as a telephone) (1010). The acoustic device is coupled to an acoustic coupler (1012) that is coupled to a further terminal. Any of: the computer (1002), modems (1004, switched network (1008), and terminals (1006, . . .) in this system may be selected to include the cyclic redundancy check remainder coefficient generator of the present invention (100). Since the mixed communication network system, not including the present invention, is known in the art, it will not be further described here.

Figure 11:
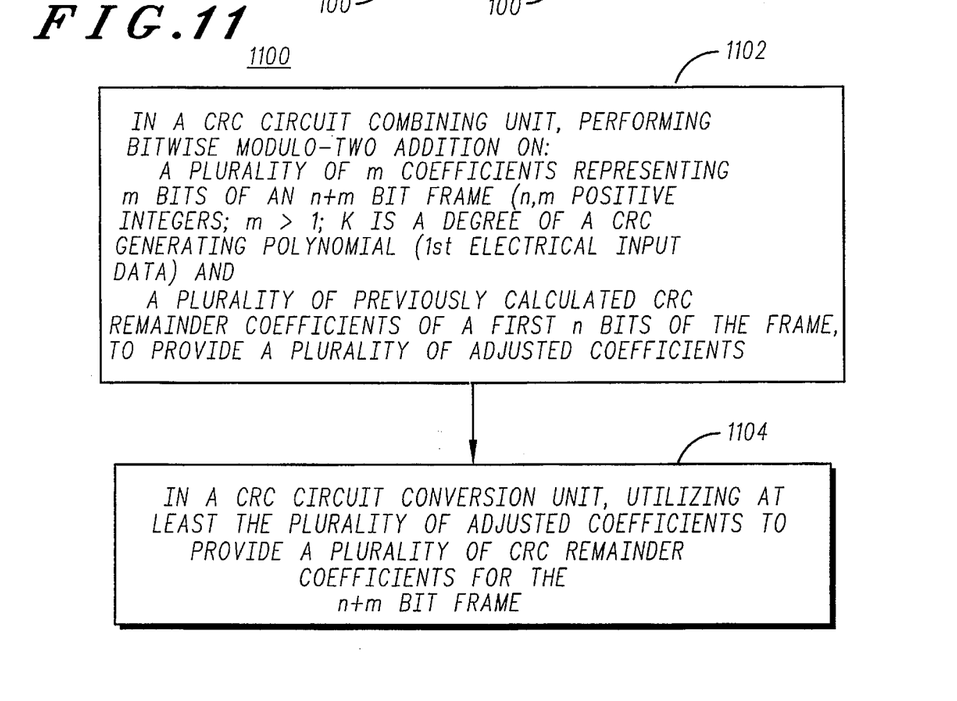
FIG. 11 is a flow chart setting forth steps in accordance with a first implementation of the method of the present invention.

FIG. 11, numeral 1100, is a flow chart setting forth steps in accordance with a first implementation of the method of the present invention, a method for generating cyclic redundancy check (CRC) remainder coefficients in a CRC circuit having a first input of data for a plurality of m coefficients representing m bits of an (n+m) bit frame (n, m are positive integers, m>1; K is a positive integer representing a degree of a CRC generating polynomial) and a second input of data for a plurality of K previously calculated CRC remainder coefficients of n bits of the frame. The method includes the steps of: (1) substantially performing, in a CRC circuit combining unit, bitwise modulo-two addition of a preselected portion of the first input data and the preselected portion of the second input data to provide a plurality of adjusted coefficients (1102); and (2) in a CRC circuit conversion unit, utilizing at least the plurality of adjusted coefficients to provide a plurality of CRC remainder coefficients for the (n+m) bit frame (1104).

In the method set forth in FIG. 11, the CRC circuit combining unit may be selected to include at least an EXCLUSIVE-OR circuit, as described above. The preselected portion of the first input data comprises one of: (1) where m≦K, all remainder coefficients of the first input data; and (2) where m>K, K highest-order remainder coefficients of the first input data. Also, the preselected portion of the second input data typically comprises one of: (1) where m>K, all remainder coefficients of the second input data; and (2) where 1<m<K, m highest-order remainder coefficients of the second input data. The CRC circuit conversion unit generally includes at least a remainder conversion unit that includes one of: (1) one memory look-up table of size $2^m$ by K, operably coupled to the CRC circuit combining means, for utilizing the plurality of adjusted coefficients to output all coefficients of the CRC intermediate remainder for the (n+m) bit frame, wherein each coefficient has been precomputed and stored in the memory look-up table; and (2) j memory look-up tables (1j<m) of size $2^b$ by K (where jb=m; 1<b<m), operably coupled to the CRC circuit combining means, for utilizing the plurality of adjusted coefficients to output all coefficients of the CRC intermediate remainder for the (n+m) bit frame, wherein each coefficient has been precomputed and stored in one of the j memory look-up tables, wherein, where selected, the coefficients of the CRC intermediate remainder for the (n+m) bit frame are stored in memory registers for output to an EXCLUSIVE-OR circuit.

Further, in the method set forth in FIG. 11, the CRC circuit conversion unit may be selected to include one of: (1) at least a first memory register unit for receiving and storing the coefficients output by the included set of table(s) (above) and a second EXCLUSIVE-OR circuit for performing bitwise modulo two addition on K–m coefficients for highest order terms of the CRC intermediate remainder for the (n+m) bit frame, and K–m coefficients of lowest order remainder terms of the second input to provide K–m CRC remainder coefficients for a K–m highest order term coefficients for the (n+m) bit frame and for outputting the K–m highest order remainder coefficients with m lowest order remainder coefficients output by the included set of table(s) to provide the CRC remainder coefficients for the (n+m) bit frame; (2) where m=bj, j memory register units for each receiving and storing K coefficients output by the included set of table(s), and a second EXCLUSIVE-OR circuit for performing bitwise modulo two addition on the K coefficients of the j memory register units to provide the CRC remainder coefficients for the (n+m) bit frame; and (3) wherein K=32, m=16, j=2, and b=8, and two 32 bit look-up tables are utilized, further being characterized by: (3a) the second EXCLUSIVE-OR circuit being utilized for receiving and processing by bitwise modulo-two addition, 16 coefficients for highest order terms from each of the two 32 bit look-up tables to provide 16 highest order remainder coefficients for the CRC remainder coefficients for the (n+m) bit frame, and (3b) a third EXCLUSIVE-OR circuit being utilized for receiving and processing by bitwise modulo-two addition, 16 coefficients for lowest order terms from each of the two 32 bit look-up tables to provide 16 lowest order remainder coefficients for the CRC remainder coefficients for the (n+m) bit frame, such that the plurality (32) of CRC remainder coefficients are provided for the (n+m) bit frame.

Similarly, where K=32, m=8, j=1, and b=8, the method set forth in FIG. 11 typically provides that (1) the preselected remainder coefficients of the second input data are 8 coefficients for highest order terms of the second input data, (2) the CRC circuit combining unit includes at least a first EXCLUSIVE-OR circuit for receiving and performing bitwise modulo two addition on the preselected remainder coefficients and the first input data to provide 8 intermediate coefficients; and (3) the CRC circuit conversion unit includes: (3a) a 32 bit memory look-up table for utilizing the 8 intermediate coefficients to output 32 coefficients of an intermediate 32 bit CRC remainder for the (n+m) bit frame, wherein each coefficient has been precomputed and stored in the memory look-up tables; (3b) a first storage register (1st SR) unit for receiving and storing, for 1st SR output, the 32 coefficients of the intermediate 32 bit CRC remainder, (3c) a shifting unit for receiving and shifting left by 8 bits (and inserting 8 zeros as lowest order term coefficients), 24 coefficients for lowest order terms of the second input data to provide a shift unit output, (3d) a second storage register (2nd SR) unit for receiving and storing, for 2nd SR output, the shifting unit output (data for 32 coefficients), and (3e) a second EXCLUSIVE-OR circuit, for receiving the 1st SR output and the 2nd SR output, for performing bitwise modulo-two addition on the 1st SR output and 2nd SR output to provide the plurality (32) of CRC remainder coefficients for the (n+m) bit frame.

Figure 12:
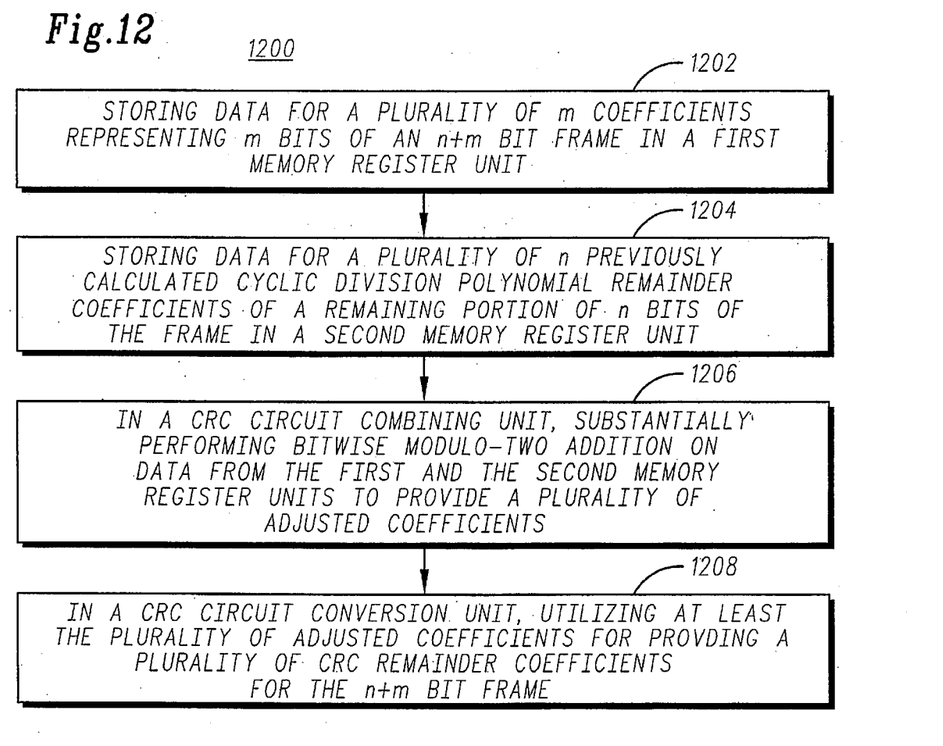
FIG. 12 is a flow chart setting forth steps in accordance with a second implementation of the method of the present invention.

FIG. 12, numeral 1200, is a flow chart setting forth steps in accordance with a second implementation of the method of the present invention, a method for generating cyclic redundancy check (CRC) remainder coefficients in a CRC circuit. The method includes the steps of: (1) storing data for a plurality of m coefficients representing m bits of an (n+m) bit frame (n, m are positive integers, 1<m<K; K is a positive integer representing a degree of a CRC generating polynomial) in a first memory register unit (1202), (2) storing data for a plurality of K previously calculated cyclic division polynomial remainder coefficients of a remaining portion of n bits of the frame in a second memory register unit (1204), (3) in a CRC circuit combining unit, substantially performing bitwise modulo-two addition on data from the first memory register storage unit and on a preselected portion of data from the second memory register unit to provide a plurality of adjusted coefficients (1206); and (4) in a CRC circuit conversion unit, utilizing at least the plurality of adjusted coefficients for providing a plurality of CRC remainder coefficients for the (n+m) bit frame (1208), wherein the CRC circuit is in a modem. This implementation may also include the additional elements described above for FIG. 11. Thus, those further descriptions for the method in FIG. 12 are not repeated here.

It is clear, for example, that the present invention may be implemented in a LAN (local area network), a WAN (wide area network), or a MAN (metropolitan area network).

Figure 13:
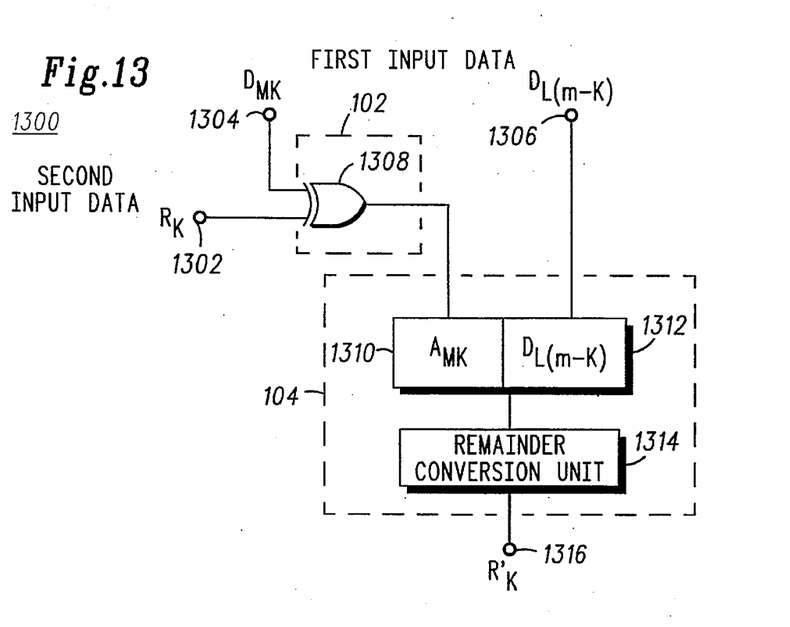
FIG. 13 is a block diagram of an embodiment of a cyclic redundancy check (CRC) remainder coefficient generator in a CRC circuit in accordance with the present invention wherein m>K.

Clearly, the implementation where 1<m<K may be extended to the case where m>K, as is illustrated in FIG. 13, where $D_{MK}=[d_{m-1}, d_{m-2}, \ldots, d_{m-K}]$, $D_{L(m-K)}=[d_{m-K-1}, \ldots, d_0]$, and $R_K=[r_{K-1}, r_{K-2}, \ldots, r_0]$. Note that it is very similar to the special case of m=K except that $R_K$ is XORed with $D_{MK}$ only. This case is useful where K is small relative to a word length of a processor/device, as in header checking for asynchronous transfer mode cells.

FIG. 13, numeral 1300, is a block diagram of an embodiment of a cyclic redundancy check (CRC) remainder coefficient generator in a CRC circuit in accordance with the present invention wherein m>K. Here $R_K$ represents a K-bit previously calculated CRC remainder $[r_0, r_1, \ldots, r_{K-1}]$ (1302), $D_{MK}$ (1304) represents K most significant bits of the m data bits, and $D_{L(m-K)}$ (1306) represents (m–K) bits of a least significant portion of the m data bits. In this implementation, the CRC circuit combining unit (102) includes an EXCLUSIVE-OR circuit (1308) that performs bitwise modulo-two addition of $R_K$ (1302) and $D_{MK}$ (1304), outputting K adjusted coefficients ($A_{MK}$) (1310) that represent K most significant coefficients of an intermediate result, typically to a register (1310) of the CRC circuit conversion unit (104). The (m–K) bits of the least significant portion of the m data bits ($D_L$(m–K) (1306)), may be implemented, for example, by utilizing an (m–K) least significant bit portion of a register (1312) and inputting $A_{MK}$ (1310) and $D_{L(m-K)}$ (1306) into a Remainder Conversion Unit (1314). Thus, the CRC circuit conversion unit (104) in this implementation includes a Remainder Conversion Unit (1314), implemented as described above for Remainder Conversion Unit 2 (308), that outputs a K-bit remainder $R'_K$ (1316), representing all the coefficients of the CRC remainder. Where selected, the CRC remainder coefficients for the (n+m) frame may be stored as a set of bits in a memory register. It is clear to one skilled in the art that, in one implementation, a register 1304/1306 may be the same register as register 1310/1312.

A 16-bit CRC may be implemented using the method (700) in a 16-bit DSP processor, for example a DSP56156 processor, with m=16, j=2 and b=8, thereby reducing processor loading by 43% relative to the fastest prior art method which uses m=8, j=1, and b=8. A 32-bit CRC may be implemented using the method (600) in a 16-bit DSP processor with m=16, j=2, and b=8, thereby reducing the processor loading by 41% relative to the fastest prior art method which uses m=8, j=1, and b=8. Hardware implementation of the new method provides similar benefits with respect to throughput and area.

Although exemplary embodiments are described above, it will be obvious to those skilled in the art that many alterations and modifications may be made without departing from the invention. Accordingly, it is intended that all such alternations and modifications be included within the spirit and scope of the invention as defined in the appended claims.

We claim:

1. A cyclic redundancy check (CRC) remainder coefficient generator in a CRC circuit having a first input of data for a plurality m of coefficients representing the last m bits of an (n+m) bit frame (n is a positive integer) and a second input of data for a plurality K (where K is a positive integer representing a degree of a CRC generating polynomial) of previously calculated CRC remainder coefficients of the first n bits of the frame, said CRC remainder coefficient generator comprising:

1A) CRC circuit combining means, operably coupled to receive a preselected portion of data from said first input of data and a preselected portion of data from said second input of data, for performing bitwise modulo-two addition of the preselected portion of data from said first input of data and the preselected portion of data from said second input of data to provide a plurality of adjusted coefficients; and 1B) CRC circuit conversion means, operably coupled at least to the CRC circuit combining means, comprising a combination of a plurality of look-up tables and at least a first EXCLUSIVE-OR circuit, for utilizing at least the plurality of adjusted coefficients to provide a plurality of CRC remainder coefficients for the (n+m) bit frame, wherein the CRC circuit conversion means includes at least a remainder conversion unit that includes j memory look-up tables (1<j<m) of size $2^b$ by K (where jb=m), operably coupled to the CRC circuit combining means, for utilizing at least the plurality of adjusted coefficients to output all coefficients of the CRC intermediate remainder for the (n+m) bit frame, and wherein each coefficient has been precomputed and stored in one of the j memory look-up tables, wherein, where selected, the coefficients of the CRC intermediate remainder for the (n+m) bit frame are stored in memory registers for output to a second EXCLUSIVE-OR circuit.

2. The generator of claim 1, wherein: b=8 or b=16.

3. The generator of claim 1, wherein the CRC circuit conversion means further includes a second EXCLUSIVE-OR circuit, operably coupled to j register means, each of which is operably coupled to a separate one of the j memory look-up tables such that the circuit receives j sets of K coefficients for the CRC intermediate remainder, for performing bitwise modulo-two addition (j−1 times) on said coefficients to provide the CRC remainder coefficients for the (n+m) bit frame.

4. The generator of claim 3, wherein K=32, m=16, j=2, and b=8, and two 32 bit look-up tables are utilized and, wherein the second EXCLUSIVE-OR circuit includes:

4A) a first intermediate EXCLUSIVE-OR circuit, operably coupled to receive and process by bitwise modulo-two addition, 16 coefficients for lowest order terms from each of the two 32 bit look-up tables;

4B) a second intermediate EXCLUSIVE-OR circuit, operably coupled to receive and process by bitwise modulo-two addition, 16 coefficients for highest order terms from each of the two 32 bit look-up tables;

4C) remainder means, operably coupled to the first intermediate EXCLUSIVE-OR circuit and to the second intermediate EXCLUSIVE-OR circuit, for storing 16 coefficients for highest order terms of an intermediate remainder and 16 coefficients for lowest order coefficients of a CRC remainder for the (n+m) bit frame; and 4D) a third intermediate EXCLUSIVE-OR circuit, operably coupled to the second EXCLUSIVE-OR circuit and to receive 16 lowest order coefficients of data from said second input of data for the plurality of K previously calculated CRC remainder coefficients of n bits, for performing bitwise modulo-two addition on the 16 coefficients for highest order terms of an intermediate remainder and the 16 lowest order coefficients of the second input of data to provide 16 highest order term coefficients that, together with the 16 lowest order coefficients (from the remainder means) of the CRC remainder coefficients for the (n+m) bit frame, represent all (32) CRC remainder coefficients for the (n+m) bit frame.

5. A cyclic redundancy check (CRC) remainder coefficient generator in a communication network system, said CRC remainder coefficient generator comprising:

5A) first storage means for storing data for a plurality m of coefficients representing the last m bits of an (n+m) bit frame (n is a positive integer);

5B) second storage means for storing data for a plurality of previously calculated CRC remainder coefficients of a precomputed CRC remainder for the first n bits of the frame;

5C) an EXCLUSIVE-OR circuit, operably coupled to the first storage means and to the second storage means, for performing bitwise modulo-two addition on a preselected portion of first storage means data and on a preselected portion of second storage means data to provide a plurality of adjusted coefficients;

5D) CRC circuit conversion means, operably coupled at least to the EXCLUSIVE-OR circuit, comprising a combination of a plurality of look-up tables and at least a first EXCLUSIVE-OR circuit, for utilizing at least the plurality of adjusted coefficients to provide a plurality of CRC remainder coefficients for the (n+m) bit frame, wherein the CRC circuit conversion means includes at least a remainder conversion unit that includes j memory look-up tables (1<j<m) of size $2^b$ by K (where jb=m), operably coupled to the CRC circuit combining means, for utilizing at least the plurality of adjusted coefficients to output all coefficients of the CRC intermediate remainder for the (n+m) bit frame, and wherein each coefficient has been precomputed and stored in one of the j memory look-up tables, wherein, where selected, the coefficients of the CRC intermediate remainder for the (n+m) bit frame are stored in memory registers for output to a second EXCLUSIVE-OR circuit.

6. The generator of claim 5 wherein: b=8 or b=16.

7. The generator of claim 5, wherein the CRC circuit conversion means further includes a second EXCLUSIVE-OR circuit, operably coupled to j register means, each of which is operably coupled to a separate one of the j memory look-up tables such that the circuit receives j sets of K coefficients for a CRC intermediate remainder, for performing bitwise modulo-two addition (j−1 times) on said coefficients to provide the CRC remainder coefficients for the (n+m) bit frame.

8. The generator of claim 7, wherein K=32, m–16, j=2, and b=8, and two 32 bit look-up tables are utilized, wherein the second EXCLUSIVE-OR circuit includes:

8A) a first intermediate EXCLUSIVE-OR circuit, operably coupled to receive and process by bitwise modulo-two addition, 16 coefficients for lowest order remainder terms from each of the two 32 bit look-up tables;

8B) a second intermediate EXCLUSIVE-OR circuit, operably coupled to receive and process by bitwise modulo-two addition, 16 coefficients for highest order remainder terms from each of the two 32 bit look-up tables;

8C) remainder means, operably coupled to the first intermediate EXCLUSIVE-OR circuit and to the second intermediate EXCLUSIVE-OR circuit, for storing 16 coefficients for highest order terms of an intermediate remainder and 16 lowest order coefficients of a CRC remainder for the (n+m) bit frame; and 8D) a third intermediate EXCLUSIVE-OR circuit, operably coupled to the second EXCLUSIVE-OR circuit and to receive 16 lowest order coefficients of the second storage means data for the plurality of K previously calculated CRC remainder coefficients of n bits, for performing bitwise modulo-two addition on the 16 highest order coefficients of an intermediate remainder and the 16 lowest order coefficients of the second storage means data to provide 16 highest order coefficients that, together with the 16 lowest order coefficients (from the remainder means) of the CRC remainder coefficients for the (n+m) bit frame, represent all (32) CRC remainder coefficients for the (n+m) bit frame.

9. A method for generating cyclic redundancy check (CRC) remainder coefficients in a CRC circuit having a first input of data for a plurality m of coefficients representing the last m bits of an (n+m) bit frame (n is a positive integer ); and a second input of data for a plurality K (K is a positive integer representing a degree of a CRC generating polynomial) of previously calculated CRC remainder coefficients of the first n bits of the frame, comprising the steps of:

9A) performing, in a CRC circuit combining unit, bitwise modulo-two addition of a preselected portion of data from said first input of data and a preselected portion of data from said second input of data to provide a plurality of adjusted coefficients; and 9B) in a CRC circuit conversion unit comprising a combination of a plurality of look-up tables and at least a first EXCLUSIVE-OR circuit, utilizing at least the plurality of adjusted coefficients to provide a plurality of CRC remainder coefficients for the (n+m) bit frame, wherein the CRC circuit combining unit includes at least an EXCLUSIVE-OR circuit, wherein the preselected portion of data from said first input of data that the at least first EXCLUSIVE-OR circuit is coupled to receive comprises one of:

9C) where m>K,
K most significant coefficients of data from said first input of data; and 9D) where 1<m≦K,
all coefficients of data from said first input of data, wherein the preselected portion of data from said second input of data comprises one of:

9E) where m>K,
all remainder coefficients of data from said second input of data; and 9F) where 1<m≦K,
m highest-order remainder coefficients of data from said second input of data, wherein the CRC circuit conversion unit includes at least a remainder conversion unit that includes j memory look-up tables (1<j<m) of size $2^b$ by K (where jb=m), operably coupled to the CRC circuit combining unit, for utilizing at least the plurality of adjusted coefficients to output all coefficients of the CRC intermediate remainder for the (n+m) bit frame, and wherein each coefficient has been precomputed and stored in one of the j memory look-up tables, wherein, where selected, the coefficients of the CRC intermediate remainder for the (n+m) bit frame are stored in memory registers for output to an EXCLUSIVE-OR circuit.

10. The method of claim 9 wherein: b=8 or b=16.

11. The method of claim 9 wherein the CRC circuit conversion means further includes a second EXCLUSIVE-OR circuit, operably coupled to j register means, each of which is operably coupled to a separate one of the j memory look-up tables such that the circuit receives j sets of K coefficients of a CRC intermediate remainder, for performing bitwise modulo-two addition (j–1 times) on said coefficients to provide the CRC remainder coefficients for the (n+m) bit frame.

12. The method of claim 11, wherein K=32, m=16, j=2, and b=8, and two 32 bit look-up tables are utilized and, wherein the second EXCLUSIVE-OR circuit includes:

12A) a first intermediate EXCLUSIVE-OR circuit, operably coupled to receive and process by bitwise modulo-two addition, 16 coefficients for lowest order remainder terms from each of the two 32 bit look-up tables;

12B) a second intermediate EXCLUSIVE-OR circuit, operably coupled to receive and process by bitwise modulo-two addition, 16 coefficients for highest order remainder terms from each of the two 32 bit look-up tables;

12C) remainder means, operably coupled to the first intermediate EXCLUSIVE-OR circuit and to the second intermediate EXCLUSIVE-OR circuit, for storing 16 coefficients for highest order remainder terms of an intermediate remainder and 16 lowest order coefficients of a CRC remainder for the (n+m) bit frame; and 12D) a third intermediate EXCLUSIVE-OR circuit, operably coupled to the second EXCLUSIVE-OR circuit and to receive 16 lowest order coefficients of the second input of data for the plurality of K previously calculated CRC remainder coefficients of n bits, for performing bitwise modulo-two addition on the 16 coefficients for highest order terms of an intermediate remainder and the 16 lowest order coefficients of the second input of data to provide 16 highest order coefficients that, together with the 16 lowest order coefficients (from the remainder means) of the CRC remainder coefficients for the (n+m) bit frame, represent all (32) CRC remainder coefficients for the (n+m) bit frame.

13. A method for generating cyclic redundancy check (CRC) remainder coefficients in a CRC circuit in a communication network system, comprising the steps of:

13A) storing data for a plurality m of coefficients representing the last m bits of an (n+m) bit frame (n is a positive integer) in the first memory register unit;

13B) storing data for a plurality K (K is a positive integer representing the degree of a CRC generating polynomial) of previously calculated cyclic division polynomial remainder coefficients of a remaining portion of the first n bits of the frame in a second memory register unit;

13C) in a CRC circuit combining unit, performing bitwise modulo-two addition on data from a preselected portion of the first memory register storage unit and on a preselected portion of the data from the second memory register unit to provide a plurality of adjusted coefficients;

13D) in a CRC circuit conversion unit comprising a combination of a plurality of look-up tables and at least a first EXCLUSIVE-OR circuit, utilizing at least the plurality of adjusted coefficients to provide a plurality of CRC remainder coefficients for the (n+m) bit frame, wherein the CRC circuit combining unit includes at least an EXCLUSIVE-OR circuit, wherein the CRC circuit conversion unit includes at least a remainder conversion unit that includes j memory look-up tables ($1<j<m$) of size $2^b$ by K (where jb=m), operably coupled to the CRC circuit combining means, for utilizing at least the plurality of adjusted coefficients to output all coefficients of the CRC intermediate remainder for the (n+m) bit frame, and wherein each coefficient has been precomputed and stored in one of the j memory look-up tables, wherein, where selected, the coefficients of the CRC intermediate remainder for the (n+m) bit frame are stored in memory registers for output to a second EXCLUSIVE-OR circuit.

14. The method of claim 13 wherein: b=8 or b=16.

15. The method of claim 13 wherein the CRC circuit conversion means further includes a second EXCLUSIVE-OR circuit, operably coupled to j register means, each of which is operably coupled to a separate one of the j memory look-up tables such that the circuit receives j sets of K coefficients a CRC intermediate remainder, for performing bitwise modulo-two addition (j–1 times) on said coefficients to provide the CRC remainder coefficients for the (n+m) bit frame.

16. The method of claim 15, wherein K=32, m=16, j=2, and b=8, and two 32 bit look-up tables are utilized, wherein the second EXCLUSIVE-OR circuit includes:

16A) a first intermediate EXCLUSIVE-OR circuit, operably coupled to receive and process by bitwise modulo-two addition, 16 coefficients for lowest order remainder terms from each of the two 32 bit look-up tables;

16B) a second intermediate EXCLUSIVE-OR circuit, operably coupled to receive and process by bitwise modulo-two addition, 16 coefficients for highest order remainder terms from each of the two 32 bit look-up tables;

16C) remainder means, operably coupled to the first intermediate EXCLUSIVE-OR circuit and to the second intermediate EXCLUSIVE-OR circuit, for storing 16 coefficients for highest order remainder terms of an intermediate remainder and 16 lowest order coefficients of a CRC remainder for the (n+m) bit frame; and 16D) a third intermediate EXCLUSIVE-OR circuit, operably coupled to the second EXCLUSIVE-OR circuit and to receive 16 lowest order coefficients of the data from the second memory register unit for the plurality of K previously calculated CRC remainder coefficients of n bits, for performing bitwise modulo-two addition on the 16 coefficients for highest order remainder terms of an intermediate remainder and the 16 lowest order coefficients of the second input of data to provide 16 highest order coefficients that, together with the 16 lowest order coefficients (from the remainder means) of the CRC remainder coefficients for the (n+m) bit frame, represent all (32) CRC remainder coefficients for the (n+m) bit frame.

* * * * *